(12) United States Patent
Tsubokura et al.

(10) Patent No.: US 6,391,814 B1
(45) Date of Patent: May 21, 2002

(54) PIEZOELECTRIC CERAMIC AND PIEZOELECTRIC DEVICE USING SAME

(75) Inventors: Taeko Tsubokura; Takeo Tsukada; Takeshi Nomura, all of Tokyo (JP)

(73) Assignee: TDK Corporation, Tokyo (JP)

( * ) Notice: Subject to any disclaimer, the term of this patent is extended or adjusted under 35 U.S.C. 154(b) by 27 days.

(21) Appl. No.: 09/593,545

(22) Filed: Jun. 14, 2000

(30) Foreign Application Priority Data

Jul. 2, 1999  (JP) ............................................ 11-188338

(51) Int. Cl.$^7$ .................................................. H01F 4/00
(52) U.S. Cl. ....................... 501/136; 501/134; 501/135; 252/62.9 R; 252/62.9 PZ
(58) Field of Search ...................... 252/62.9 R, 62.9 PZ; 501/134, 135, 136

(56) References Cited

FOREIGN PATENT DOCUMENTS

| JP | B2-59-41311 | 10/1984 |
| JP | 62-246856 | * 10/1987 |
| JP | A-5-58724 | 3/1993 |
| JP | A-6-112542 | 4/1994 |
| JP | A-11-292623 | 10/1999 |

* cited by examiner

Primary Examiner—C. Melissa Koslow
(74) Attorney, Agent, or Firm—Oliff & Berridge, PLC

(57) ABSTRACT

A piezoelectric ceramic having a carbon content after sintering of less than 37 ppm by weight and a piezoelectric device such as a ceramic resonator, ceramic filter, piezoelectric element, piezoelectric buzzer, piezoelectric transformer, and ultrasonic vibrator using the same.

18 Claims, 3 Drawing Sheets

PIEZOELECTRIC CERAMIC AND PIEZOELECTRIC DEVICE USING SAME

BACKGROUND OF THE INVENTION

1. Field of the Invention

The present invention relates to a piezoelectric ceramic mainly comprised for example of a PZT (zirconia-lead titanate)-based material or PT (lead titanate)-based material and a piezoelectric device using the same, more particularly relates to a piezoelectric ceramic superior in mechanical strength while maintaining its piezoelectric characteristics and easy to produce inexpensively and a piezoelectric device using the same.

2. Description of the Related Art

This type of piezoelectric ceramic is widely used for piezoelectric resonators, ceramic filters, piezoelectric elements, piezoelectric buzzers, piezoelectric transformers, ultrasonic vibrators, and other piezoelectric devices.

Among these, high frequency ceramic resonators and other high frequency piezoelectric devices use the above PZT-based materials and PT-based materials and, further, ceramic materials consisting of these plus second ingredients or third ingredients substituted with these and additives added (for example, see Japanese Unexamined Patent Publication (Kokai) No. 5-58724).

In a device like a piezoelectric device driven by a large amplitude, impact, of course, and also a rise in the input voltage causing oscillation at a large amplitude are liable to sometimes cause destruction at a stress concentration point called a "node point", so a piezoelectric ceramic device is considered required to have a sufficiently large mechanical strength while maintaining its piezoelectric characteristics when made particularly thin.

For example, Japanese Unexamined Patent Publication (Kokai) No. 6-112542 proposed to make the particle size of the powder material small to reduce the surface ratio to less than 10 m²/g and to provisionally sinter it at a temperature of less than 650° C. to reduce the crystalline size of the device to less than 1 μm since there is a large correlation between voids and other crystal defects and mechanical strength in a piezoelectric ceramic. Further, it proposed to enhance the mechanical strength by the hot press method.

Further, to improve one of the piezoelectric characteristics, the electromechanical coupling factor kt, for example, Japanese Examined Patent Publication (Kokoku) No. 59-41311 proposes to replace part of the lead oxide in a composition mainly comprised of lead titanate with samarium oxide.

In this method of improving the mechanical strength by making the powder material finer in size, however, a separate step is required for making the powder finer in size. Further, the fine powder material is extremely difficult to handle in the manufacture of a piezoelectric ceramic device.

Further, in the method of increasing the mechanical strength by the hot press method, the manufacturing time becomes longer and, further, expensive equipment is required, so there is a large cost demerit.

On the other hand, in the method of increasing the electromechanical coupling factor kt by replacing part of the lead oxide by samarium oxide, there were the problems that the composition become off and the piezoelectric characteristics deteriorated or that the costs became higher since a relatively inexpensive oxide was required.

SUMMARY OF THE INVENTION

An object of the present invention is to provide a piezoelectric ceramic superior in mechanical strength while maintaining its piezoelectric characteristics and easy to produce inexpensively and a piezoelectric device using the same.

To achieve this object, according to a first aspect of the present invention, there is provided a piezoelectric ceramic having a carbon content after sintering of less than 37 ppm by weight.

According to a second aspect of the present invention, there is provided a piezoelectric ceramic mainly comprised of lead zirconate titanate and having a carbon content after sintering of less than 36 ppm by weight. The lead zirconate titanate in this case is preferably where, $0 < x < 0.1$ $2/6 < y < 5/6$ $0.01 \leq a \leq 0.2$ $0.2 \leq b \leq 0.6$ $a + b + c = 1$ $0.9 \leq n \leq 1.1$

M: one or more of Ca, Ba, and Sr

A1: one or more of Nb, Sb, Ta, W, and V

A2: one or more of Mg, Mn, Fe, Co, Ni, Zn, Sn, Cu, Cr, Sr, Y, Bi, and Ln (Ln: lanthanoid element).

Further, the first and second aspects of the invention more preferably have carbon contents after sintering of over 3 ppm by weight.

Further, according to a third aspect of the present invention, there is provided a piezoelectric ceramic mainly comprised of lead titanate and having a carbon content after sintering of less than 37 ppm by weight. The lead titanate in this case is preferably where, $0 < x < 0.1$ $0.01 \leq a \leq 0.5$ $0.01 \leq b \leq 0.30$ $0.005 \leq x \leq 0.05$ $0.005 \leq y \leq 0.05$ $0.9 \leq n \leq 1.1$ M: one or more of Ca, Ba, Sr, and Ln (Lan: lanthanoid element).

In the third aspect of the invention, the carbon content after sintering is more preferably over 4 ppm by weight.

The present inventors further took note of the carbon content of the piezoelectric after sintering and discovered that the mechanical strength could be sufficiently raised by making it less than 37 ppm by weight (less than 36 ppm by weight for the second aspect of the invention and less than 37 ppm by weight for the third aspect of the invention). Further, to maintain the piezoelectric characteristics, in the first and second aspects of the present invention, the carbon content is preferably over 3 ppm by weight (over 4 ppm by weight in the third aspect of the present invention).

A more preferable range of carbon content is 7 ppm by weight to 29 ppm by weight (8 ppm by weight to 29 ppm by weight for the third aspect of the invention).

If the carbon content after sintering is 3 ppm by weight (4 ppm by weight for the third aspect of the invention), the electromechanical coupling factor kt and other piezoelectric characteristics fall and the transmittance band of the signal when used for a piezoelectric ceramic filter is limited, but this is not a practical problem.

Conversely, if the carbon content after sintering is 37 ppm by weight (36 ppm by weight for the second aspect of the invention and 37 ppm by weight for the third aspect of the invention), it is not possible to obtain a sufficiently sintered material body.

Note that the carbon content after sintering is mainly due to the carbonates of the material of the piezoelectric and the carbon component in the organic binder.

The piezoelectric ceramics according to the first to third aspects of the invention may be used as the piezoelectric of piezoelectric resonators, ceramic filters, piezoelectric elements, piezoelectric buzzers, piezoelectric transformers, ultrasonic vibrators, and other piezoelectric devices. Among these, the piezoelectric ceramic according to the second aspect of the present invention is preferably applied to a piezoelectric element or piezoelectric transformer or other drive device, while the piezoelectric ceramic according to the third aspect of the present invention is preferably applied to a resonator or filter etc.

According to the present invention, it is possible to provide a piezoelectric ceramic superior in mechanical strength while maintaining its piezoelectric characteristics and easy to produce inexpensively and a piezoelectric device using the same.

The present disclosure relates to subject matter contained in Japanese Utility Model Application No. HEI 11-188338, filed on Jul. 2, 1999, the disclosure of which is expressly incorporated herein by reference in its entirety.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

The piezoelectric ceramic of the present embodiment mainly comprises a PZT-based ceramic of the general formula $(Pb_{1-x}M_x)_n\{A1_yA2_{(1-y)}\}_aTi_bZr_cO_3$ (where, $0<x<0.1$, $2/6<y<5/6$, $0.01 \leq a \leq 0.2$, $0.2 \leq b \leq 0.6$, $a+b+c=1$, $0.9 \leq n \leq 1.1$, M: one or more of Ca, Ba, and Sr, A1: one or more of Nb, Sb, Ta, W, and V, and A2: one or more of Mg, Mn, Fe, Co, Ni, Zn, Sn, Cu, Cr, Sr, Y, Bi, and Ln (Ln: lanthanoid element)) or a PT-based ceramic of the general formula $(Pb_{1-a-b}M_aBi_b)_n(Ti_{1-x-yMnx}Nb_y)O_3$ (where, $0<x<0.1$, $0.01 \leq a \leq 0.5$, $0.01 \leq b \leq 0.30$, $0.005 \leq x \leq 0.05$, $0.005 \leq y \leq 0.05$, $0.9 \leq n \leq 1.1$, and M; one or more of Ca, Ba, Sr, and Ln (Ln: lanthanoid element).

The Pb complex oxide of the above main composition forms a Perovskite main phase, but does not have to be complete solid solution. Further, the piezoelectric ceramic of the present invention need only have an overall composition in the above range and does not have to be completely homogeneous, for example, may include different phases.

The average particle size of the starting material of the piezoelectric ceramic of the present invention is preferably from 1.0 to 5.0 μm. Further, while not particularly limited, the crystalline size of the piezoelectric ceramic of the present invention is preferably 0.5 to 10 μm, particularly preferably 1 to 5 μm.

The provisional sintering is preferably performed at a temperature of 800 to 1100° C. for 1 to 3 hours. This provisional sintering may be performed in the atmosphere or may be performed in an atmosphere with an oxygen partial pressure higher than the atmosphere or a pure oxygen atmosphere.

The provisionally sintered material obtained from this is next wet-pulverized using a ball mill etc. At this time, as the solvent of the slurry, water or ethanol or another alcohol or a mixed solvent of water and ethanol is preferably used. The wet pulverization is preferably performed until the average particle size of the provisionally sintered material becomes 0.5 to 2.0 μm or so.

The wet pulverized slurry is dried, then a binder is added to the powder of the provisionally sintered material and the result pressed. As a binder, polyvinyl alcohol, polyvinyl alcohol plus a dispersant, ethyl cellulose, or another organic binder generally used may be mentioned.

After the binder is added and the mixture pressed, treatment is performed to remove the binder. This debinder treatment is preferably performed at a temperature of 300 to 700° C. for 0.5 to 5 hours or so. The debinder treatment may be performed in the atmosphere or may be performed in an atmosphere with an oxygen partial pressure higher than the atmosphere or in a pure oxygen atmosphere.

After the debinder treatment, the product is sintered at a temperature of 1100 to 1300° C. for 0.5 to 5 hours or so. The sintering may be performed in the atmosphere or in an atmosphere with an oxygen partial pressure higher than the atmosphere or in a pure oxygen atmosphere.

Note that the debinder step and the sintering step may be performed continuously or may be performed separately.

Figure 1:
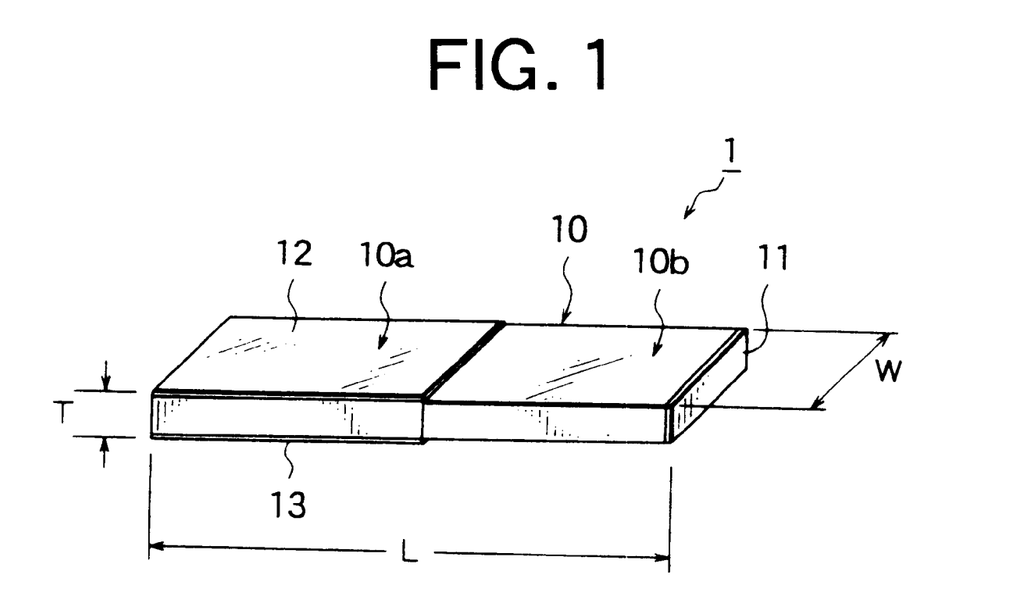
FIG. 1 is a perspective view of a piezoelectric device according to an embodiment of the present invention.

Next, an explanation will be made of a piezoelectric transformer using the piezoelectric ceramic of the present invention described above. FIG. 1 is a perspective view of an embodiment of the piezoelectric transformer of the present invention.

The piezoelectric transformer 1 of this example has a device body 10 of a rectangular plate shape. This device body 10 is for example made one of a length L of 15 to 40 mm, a width W of 3 to 7 mm, and a thickness T of 0.7 to 1.5 mm.

At one end face of the device body 10 is provided an output electrode 11 formed by a conductive layer. At the other top and bottom faces of the other end are provided input electrodes 12 and 13 formed by the same conductive layer. These input electrodes 12 and 13 and output electrodes 11 are for example made using silver or other conductors and are made a thickness of 1 to 20 μm or so.

The portion where the input electrodes 12 and 13 are provided becomes the primary side 10a, the portion where the output electrode 11 is provided becomes the secondary side 10b, the primary side 10a is polarized in the thickness direction, and the secondary side 10b is polarized in the longitudinal direction.

If applying a 1-wavelength or ½-wavelength resonance AC field V1 to the input electrodes 12 and 13, it is propagated from the primary side 10a to the secondary side 10b converted from electrical energy→resonance energy→electrical energy in that order and a high voltage V2 is taken out from the output electrode 11.

Specific examples of the present invention will be given below to explain the present invention in further detail.

EXAMPLE 1

As the starting materials, lead oxide PbO, titanium oxide $TiO_2$, zirconium oxide $ZrO_2$, antimony oxide $Sb_2O_3$, barium carbonate $BaCO_3$, and manganese carbonate $MnCO_3$ were used. These powders were weighed and blended to give the composition of the following formula (1). The blend was wet mixed by a ball mill.

$(Pb_{0.9}Ba_{0.03})\{(Sb_{2/3}Mn_{1/3})_{0.035}Ti_{0.476}Zr_{0.489}\}O_3$ (1)

These starting materials were sufficiently mixed, then provisionally sintered at 850° C. for 2 hours. The obtained provisionally sintered material was made a slurry with the addition of water, then wet-pulverized using a ball mill. The wet-pulverization was performed until the average particle size of the provisionally sintered material became 1.5 μm.

The slurry was dried, then 1 wt % of water was added as a binder with respect to 100 wt % of the powder of the provisionally sintered material. This was pressed into a shape of a length of 20 mm, width of 20 mm, and height of 15 mm at a pressure of 4 tons/cm$^2$.

Next, the pressed article was treated to remove the binder in the atmosphere at 300° C. for 1 hour. After this, it was fired at 1230° C. for 4 hours to obtain a basic sample of a piezoelectric ceramic.

Figure 2A:
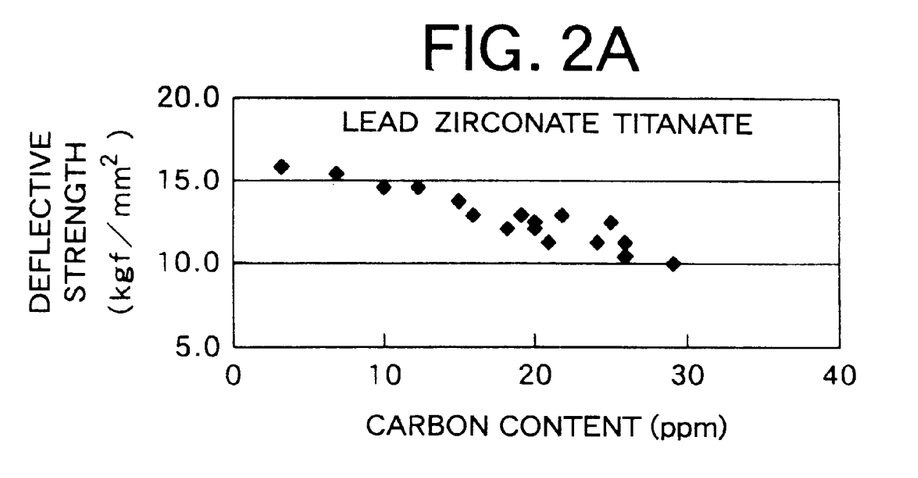
FIG. 2A and FIG. 2B are graphs of the results of Examples 1 to 17 and Comparative Examples 1 to 2 relating to the present invention.
Figure 2B:
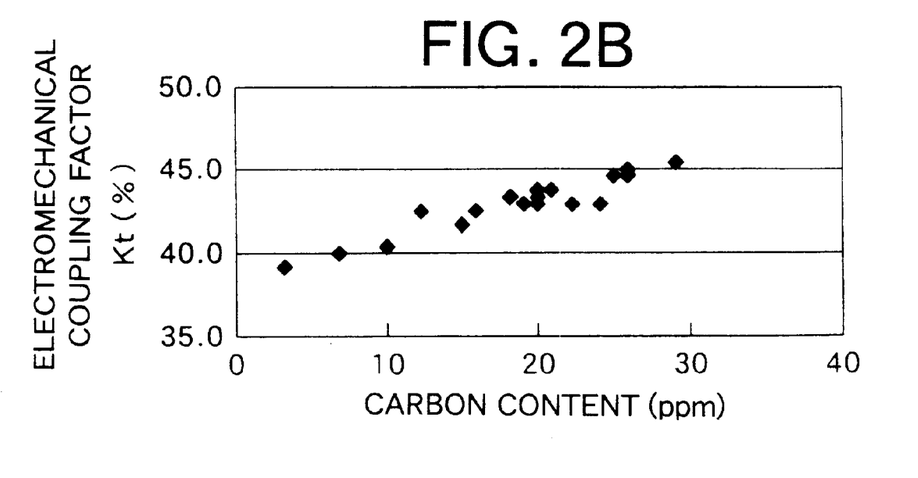

This basic sample was measured for density using the Archimedes method. Further, the carbon content was measured using a carbon-sulfur analyzer (Horiba Seisakusho EMIA520). This analyzer sinters the basic sample in an oxygen flow by high frequency heating and measures the carbon content by infrared ray absorption. The results are shown in Table 1, FIG. 2A, and FIG. 2B.

Next, the above basic sample was machined to a thickness of 0.3 to 0.4 mm, then coated on its two main faces with an Ag paste. It was further immersed in silicone oil and treated at 120° C. for 20 minutes with the application of a field of 4 to 6 kV/mm for polarization. Next, the sample was diced to a shape of 7.0 mm×4.5 mm, Ag electrodes were attached to the two main faces, and the result was used as a sample for measurement of the piezoelectric characteristics. The sample for measurement of the piezoelectric characteristics was measured for the electromechanical coupling factor kt (%) based on the EMAS-6100 standard of the Electronic Materials Manufacturers Association of Japan. The kt was found from the resonance frequency and the antiresonance frequency. The results are shown in Table 1 and FIG. 2B.

Further, the above basic sample was machined to a length of 2 mm, a width of 4 mm, and a thickness of 0.4 mm and the result used as a sample for measurement of the mechanical strength. The sample for measurement of the mechanical strength was tested for deflection based on Japan Industrial Standard JISR1601 using a digital load tester. The results are shown in Table 1 and FIG. 2A.

EXAMPLE 2

A basic sample, sample for measurement of the piezoelectric characteristics, and sample for measurement of the mechanical strength were prepared under the same conditions as in Example 1, except for using polyvinyl alcohol as the binder in Example 1, and the density, carbon content, deflective strength, and electromechanical coupling factor were measured. The results are shown in Table 1, FIG. 2A, and FIG. 2B.

EXAMPLE 3

A basic sample, sample for measurement of the piezoelectric characteristics, and sample for measurement of the mechanical strength were prepared under the same conditions as in Example 1, except for using ethyl cellulose as the binder in Example 1, and the density, carbon content, deflective strength, and electromechanical coupling factor were measured. The results are shown in Table 1, FIG. 2A, and FIG. 2B.

EXAMPLE 4

A basic sample, sample for measurement of the piezoelectric characteristics, and sample for measurement of the mechanical strength were prepared under the same conditions as in Example 1, except for making the debinder temperature in Example 1 500° C., and the density, carbon content, deflective strength, and electromechanical coupling factor were measured. The results are shown in Table 1, FIG. 2A, and FIG. 2B.

EXAMPLE 5

A basic sample, sample for measurement of the piezoelectric characteristics, and sample for measurement of the mechanical strength were prepared under the same conditions as in Example 2, except for making the debinder temperature in Example 2 500° C., and the density, carbon content, deflective strength, and electromechanical coupling factor were measured. The results are shown in Table 1, FIG. 2A, and FIG. 2B.

EXAMPLE 6

A basic sample, sample for measurement of the piezoelectric characteristics, and sample for measurement of the mechanical strength were prepared under the same conditions as in Example 5, except for adding a dispersant to the polyvinyl alcohol as the binder in Example 5, and the density, carbon content, deflective strength, and electromechanical coupling factor were measured. The results are shown in Table 1, FIG. 2A, and FIG. 2B.

EXAMPLE 7

A basic sample, sample for measurement of the piezoelectric characteristics, and sample for measurement of the mechanical strength were prepared under the same conditions as in Example 5, except for using ethyl cellulose as the binder in Example 5, and the density, carbon content, deflective strength, and electromechanical coupling factor were measured. The results are shown in Table 1, FIG. 2A, and FIG. 2B.

EXAMPLE 8

A basic sample, sample for measurement of the piezoelectric characteristics, and sample for measurement of the mechanical strength were prepared under the same conditions as in Example 1, except for making the debinder temperature in Example 1 700° C., and the density, carbon content, deflective strength, and electromechanical coupling factor were measured. The results are shown in Table 1, FIG. 2A, and FIG. 2B.

EXAMPLE 9

A basic sample, sample for measurement of the piezoelectric characteristics, and sample for measurement of the mechanical strength were prepared under the same conditions as in Example 8, except for using polyvinyl alcohol as the binder in Example 8, and the density, carbon content, deflective strength, and electromechanical coupling factor were measured. The results are shown in Table 1, FIG. 2A, and FIG. 2B.

EXAMPLE 10

A basic sample, sample for measurement of the piezoelectric characteristics, and sample for measurement of the mechanical strength were prepared under the same conditions as in Example 8, except for using ethyl cellulose instead of water as the binder in Example 8, and the density, carbon content, deflective strength, and electromechanical coupling factor were measured. The results are shown in Table 1, FIG. 2A, and FIG. 2B.

EXAMPLE 11

A basic sample, sample for measurement of the piezoelectric characteristics, and sample for measurement of the mechanical strength were prepared under the same conditions as in Example 3, except for making the sintering atmosphere an oxygen atmosphere in Example 3, and the density, carbon content, deflective strength, and electromechanical coupling factor were measured. The results are shown in Table 1, FIG. 2A, and FIG. 2B.

EXAMPLE 12

A basic sample, sample for measurement of the piezoelectric characteristics, and sample for measurement of the mechanical strength were prepared under the same conditions as in Example 6, except for making the sintering atmosphere an oxygen atmosphere in Example 6, and the density, carbon content, deflective strength, and electromechanical coupling factor were measured. The results are shown in Table 1, FIG. 2A, and FIG. 2B.

EXAMPLE 13

A basic sample, sample for measurement of the piezoelectric characteristics, and sample for measurement of the mechanical strength were prepared under the same conditions as in Example 7, except for making the sintering atmosphere an oxygen atmosphere in Example 7, and the density, carbon content, deflective strength, and electromechanical coupling factor were measured. The results are shown in Table 1, FIG. 2A, and FIG. 2B.

EXAMPLE 14

A basic sample, sample for measurement of the piezoelectric characteristics, and sample for measurement of the mechanical strength were prepared under the same conditions as in Example 9, except for making the sintering atmosphere an oxygen atmosphere in Example 9, and the density, carbon content, deflective strength, and electromechanical coupling factor were measured. The results are shown in Table 1, FIG. 2A, and FIG. 2B.

EXAMPLE 15

A basic sample, sample for measurement of the piezoelectric characteristics, and sample for measurement of the mechanical strength were prepared under the same conditions as in Example 12, except for making the debinder temperature in Example 12 700° C., and the density, carbon content, deflective strength, and electromechanical coupling factor were measured. The results are shown in Table 1, FIG. 2A, and FIG. 2B.

EXAMPLE 16

A basic sample, sample for measurement of the piezoelectric characteristics, and sample for measurement of the mechanical strength were prepared under the same conditions as in Example 8, except for making the sintering atmosphere an oxygen atmosphere in Example 8, and the density, carbon content, deflective strength, and electromechanical coupling factor were measured. The results are shown in Table 1, FIG. 2A, and FIG. 2B.

EXAMPLE 17

A basic sample, sample for measurement of the piezoelectric characteristics, and sample for measurement of the mechanical strength were prepared under the same conditions as in Example 15, except for making the debinder temperature in Example 15 300° C., and the density, carbon content, deflective strength, and electromechanical coupling factor were measured. The results are shown in Table 1, FIG. 2A, and FIG. 2B.

EXAMPLE 18

A basic sample, sample for measurement of the piezoelectric characteristics, and sample for measurement of the mechanical strength were prepared under the same conditions as in Example 11, except for making the debinder temperature in Example 11 700° C., and the density, carbon content, deflective strength, and electromechanical coupling factor were measured. The results are shown in Table 1, FIG. 2A, and FIG. 2B.

Comparative Example 1

A basic sample, sample for measurement of the piezoelectric characteristics, and sample for measurement of the mechanical strength were prepared under the same conditions as in Example 6, except for making the debinder temperature in Example 6 300° C., and the density, carbon content, deflective strength, and electromechanical coupling factor were measured. The results are shown in Table 1, FIG. 2A, and FIG. 2B.

|   | Binder | Debinder temperature (° C.) | Sintering atmosphere | Residual carbon content (ppm) | Deflective strength (kgf/mm$^2$) | Electromechanical coupling factor kt (%) | Density (g/cm$^3$) | Remarks |
|---|---|---|---|---|---|---|---|---|
| Ex. 1 | Water | 300 | Air | 20 | 12.07 | 43.58 | 7.93 | |
| Ex. 2 | PVA | 300 | Air | 20 | 12.47 | 43.25 | 7.94 | |
| Ex. 3 | Ethyl cellulose | 300 | Air | 19 | 12.75 | 43.09 | 7.93 | |
| Ex. 4 | Water | 500 | Air | 25 | 12.28 | 44.83 | 7.93 | |
| Ex. 5 | PVA | 500 | Air | 18 | 11.98 | 43.56 | 7.94 | |
| Ex. 6 | PVA + | 500 | Air | 24 | 11.25 | 43.40 | 7.92 | |

-continued

| | Binder | Debinder temperature (° C.) | Sintering atmosphere | Residual carbon content (ppm) | Deflective strength (kgf/mm$^2$) | Electromechanical coupling factor kt (%) | Density (g/cm$^3$) | Remarks |
|---|---|---|---|---|---|---|---|---|
| Ex. 7 | Ethyl cellulose dispersant | 500 | Air | 26 | 11.37 | 44.86 | 7.93 | |
| Ex. 8 | Water | 700 | Air | 26 | 10.41 | 45.13 | 7.94 | |
| Ex. 9 | PVA | 700 | Air | 21 | 11.27 | 44.03 | 7.93 | |
| Ex. 10 | Ethyl cellulose | 700 | Air | 20 | 12.07 | 44.05 | 7.94 | |
| Ex. 11 | Ethyl cellulose | 300 | Oxygen | 15 | 13.63 | 41.89 | 7.94 | |
| Ex. 12 | PVA + dispersant | 500 | Oxygen | 10 | 14.74 | 40.27 | 7.95 | |
| Ex. 13 | Ethyl cellulose | 500 | Oxygen | 12 | 14.64 | 42.41 | 7.93 | |
| Ex. 14 | PVA | 700 | Oxygen | 22 | 12.77 | 43.31 | 7.94 | |
| Ex. 15 | PVA + dispersant | 700 | Oxygen | 16 | 12.90 | 42.76 | 7.94 | |
| Ex. 16 | Water | 700 | Oxygen | 7 | 15.30 | 40.20 | 7.94 | |
| Ex. 17 | PVA + dispersant | 300 | Oxygen | 29 | 10.10 | 45.60 | 7.93 | |
| Ex. 18 | Ethyl cellulose | 700 | Oxygen | 3 | 15.80 | 39.20 | 7.95 | |
| Comp. Ex. 1 | PVA + dispersant | 300 | Air | 36 | — | — | 7.23 | Characteristic unable to be evaluated |

From the above results, if the carbon content after sintering is 3 ppm (Example 18), the electromechanical coupling factor kt becomes 39.2%. In particular, when the piezoelectric ceramic is used for a filter, while the transmission band of the signal is limited, there is no problem in practice. Conversely, when the carbon content after sintering is 36 ppm (Comparative Example 1), the sample became porous and a sufficient density could not be obtained.

As opposed to this, when the carbon content after sintering is from 7 ppm (Example 16) to 29 ppm (Example 17), the electromechanical coupling factor kt became sufficiently larger to 40.27% to 45.60% and the deflective strength became sufficiently larger to 10.10 kgf/mm$^2$ to 15.30 kgf/mm$^2$.

EXAMPLE 19

As the starting materials, lead oxide PbO, titanium oxide TiO$_2$, zirconium oxide ZrO$_2$, antimony oxide Sb$_2$O$_3$, bismuth oxide Bi$_2$O$_3$, niobium oxide Nb$_2$O$_5$, barium carbonate BaCO$_3$, manganese carbonate MnCO$_3$, and strontium carbonate SrCO$_3$ were used. These powders were weighed and blended to give the composition of the following formula (2). The blend was wet mixed by a ball mill.

$$(Pb_{0.78}Ca_{0.02}Sr_{0.15}Bi_{0.01})(Ti_{0.95}Mn_{0.02}Nb_{0.03})O_3 \quad (2)$$

Figure 3A:
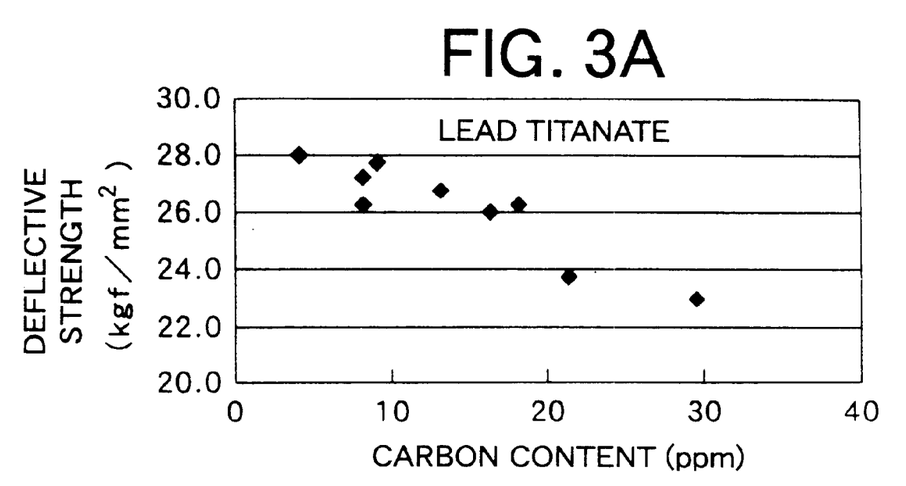
FIG. 3A and FIG. 3B are graphs of the results of Examples 18 to 25 and Comparative Examples 3 to 4 relating to the present invention.
Figure 3B:
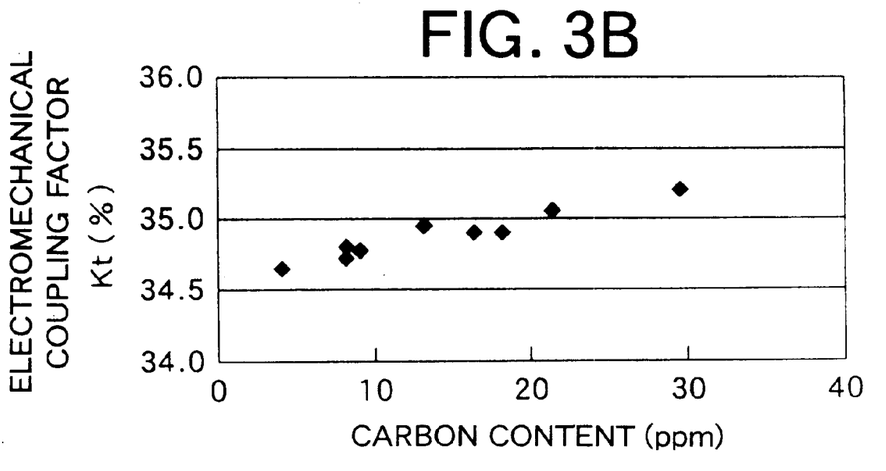

These starting materials were sufficiently mixed, then used to prepare a basic sample, sample for measurement of the piezoelectric characteristics, and sample for measurement of mechanical strength and the density, carbon content, deflective strength, and electromechanical coupling factor were measured. These results were shown in Table 2, FIG. 3A, and FIG. 3B.

EXAMPLE 20

A basic sample, sample for measurement of the piezoelectric characteristics, and sample for measurement of the mechanical strength were prepared under the same conditions as in Example 19, except for using water instead of ethyl cellulose as a binder and making the debinder temperature 500° C. in Example 19, and the density, carbon content, deflective strength, and electromechanical coupling factor were measured. The results are shown in Table 2, FIG. 3A, and FIG. 3B.

EXAMPLE 21

A basic sample, sample for measurement of the piezoelectric characteristics, and sample for measurement of the mechanical strength were prepared under the same conditions as in Example 20, except for using ethyl cellulose as a binder, and the density, carbon content, deflective strength, and electromechanical coupling factor were measured. The results are shown in Table 2, FIG. 3A, and FIG. 3B.

EXAMPLE 22

A basic sample, sample for measurement of the piezoelectric characteristics, and sample for measurement of the mechanical strength were prepared under the same conditions as in Example 20, except for making the sintering atmosphere an oxygen atmosphere in Example 20, and the density, carbon content, deflective strength, and electromechanical coupling factor were measured. The results are shown in Table 2, FIG. 3A, and FIG. 3B.

EXAMPLE 23

A basic sample, sample for measurement of the piezoelectric characteristics, and sample for measurement of the mechanical strength were prepared under the same conditions as in Example 22, except for adding a dispersant to the polyvinyl alcohol as the binder in Example 19, and the density, carbon content, deflective strength, and electromechanical coupling factor were measured. The results are shown in Table 2, FIG. 3A, and FIG. 3B.

EXAMPLE 24

A basic sample, sample for measurement of the piezoelectric characteristics, and sample for measurement of the mechanical strength were prepared under the same conditions as in Example 22, except for making the debinder temperature 700° C. in Example 22, and the density, carbon content, deflective strength, and electromechanical coupling factor were measured. The results are shown in Table 2, FIG. 3A, and FIG. 3B.

Comparative Example 2

A basic sample, sample for measurement of the piezoelectric characteristics, and sample for measurement of the mechanical strength were prepared under the same conditions as in Example 19, except for adding a dispersant to the polyvinyl alcohol as a binder in Example 19, and the density, carbon content, deflective strength, and electromechanical coupling factor were measured. The results are shown in Table 2, FIG. 3A, and FIG. 3B.

|  | Binder | Debinder temperature (° C.) | Sintering atmosphere | Residual carbon content (ppm) | Deflective strength (kgf/mm²) | Electromechanical coupling factor kt (%) | Density (g/cm³) | Remarks |
|---|---|---|---|---|---|---|---|---|
| Ex. 19 | Ethyl cellulose | 300 | Air | 16 | 25.93 | 34.90 | 7.45 |  |
| Ex. 20 | Water | 500 | Air | 8 | 26.27 | 34.81 | 7.46 |  |
| Ex. 21 | Ethyl cellulose | 500 | Air | 8 | 27.16 | 34.75 | 7.46 |  |
| Ex. 22 | Water | 500 | Oxygen | 13 | 26.74 | 34.97 | 7.47 |  |
| Ex. 23 | PVA + dispersant | 500 | Oxygen | 18 | 26.23 | 34.94 | 7.48 |  |
| Ex. 24 | Water | 700 | Oxygen | 9 | 27.62 | 34.79 | 7.49 |  |
| Ex. 25 | PVA + dispersant | 700 | Oxygen | 21 | 23.86 | 35.09 | 7.46 |  |
| Ex. 26 | Ethyl cellulose | 300 | Oxygen | 29 | 23.05 | 35.23 | 7.48 |  |
| Ex. 27 | Ethyl cellulose | 700 | Oxygen | 4 | 28.10 | 34.67 | 7.48 |  |
| Comp. Ex. 2 | PVA + dispersant | 300 | Air | 37 | — | — | 6.67 | Characteristics unable to be evaluated |

EXAMPLE 25

A basic sample, sample for measurement of the piezoelectric characteristics, and sample for measurement of the mechanical strength were prepared under the same conditions as in Example 24, except for adding a dispersant to the polyvinyl alcohol as a binder in Example 24, and the density, carbon content, deflective strength, and electromechanical coupling factor were measured. The results are shown in Table 2, FIG. 3A, and FIG. 3B.

EXAMPLE 26

A basic sample, sample for measurement of the piezoelectric characteristics, and sample for measurement of the mechanical strength were prepared under the same conditions as in Example 19, except for making the sintering atmosphere an oxygen atmosphere in Example 19, and the density, carbon content, deflective strength, and electromechanical coupling factor were measured. The results are shown in Table 2, FIG. 3A, and FIG. 3B.

EXAMPLE 27

A basic sample, sample for measurement of the piezoelectric characteristics, and sample for measurement of the mechanical strength were prepared under the same conditions as in Example 26, except for making the debinder temperature 700° C. in Example 26, and the density, carbon content, deflective strength, and electromechanical coupling factor were measured. The results are shown in Table 2, FIG. 3A, and FIG. 3B.

From the above results, if the carbon content after sintering is 4 ppm (Example 27), the electromechanical coupling factor kt becomes 34.67%. In particular, when the piezoelectric ceramic is used for a filter, while the transmission band of the signal is limited, there is no problem in practice. Conversely, when the carbon content after sintering is 37 ppm (Comparative Example 2), the sample became porous and a sufficient density could not be obtained (sintering was not possible).

As opposed to this, when the carbon content after sintering is from 8 ppm (Examples 20 and 21) to 29 ppm (Example 26), the electromechanical coupling factor kt became sufficiently larger to 34.75% to 35.23% and the deflective strength became sufficiently larger to 23.05 kgf/mm to 27.62 kgf/mm².

Note that the embodiment explained above was described to facilitate the understanding of the present invention and were not given to limit the present invention. Therefore, the elements disclosed in the above embodiment include all design changes and equivalents falling under the technical scope of the invention.

What is claimed is:

1. A piezoelectric ceramic having a carbon content after sintering of less than 37 ppm by weight, and wherein the carbon content after sintering is over 3 ppm by weight.

2. A piezoelectric ceramic as set forth in claim 1, mainly comprised of lead zirconate titanate and having a carbon content after sintering of less than 36 ppm by weight.

3. A piezoelectric ceramic as set forth in claim 2, wherein the lead zirconate titanate is of the following formula:

where,
0<x<0.1
2/6<y<5/6
0.01≤a≤0.2
0.2≤b≤0.6
a+b+c=1
0.9≤n≤1.1
M: one or more of Ca, Ba, and Sr
A1: one or more of Nb, Sb, Ta, W, and V
A2: one or more of Mg, Mn, Fe, Co, Ni, Zn, Sn, Cu, Cr, Sr, Y, Bi, and a lanthanoid element.

4. A piezoelectric ceramic as set forth in claim 2, wherein the carbon content after sintering is over 3 ppm by weight.

5. A piezoelectric ceramic as set forth in claim 3, wherein the carbon content after sintering is over 3 ppm by weight.

6. A piezoelectric ceramic as set forth in claim 1, mainly comprised of lead titanate.

7. A piezoelectric ceramic as set forth in claim 6, wherein the lead titanate is of the following formula:

where,
0<x<0.1
0.01≤a≤0.5
0.01≤b≤0.30
0.005≤x≤0.05
0.005≤y≤0.05
0.9≤n≤1.1
M: one or more of Ca, Ba, Sr, and a lanthanoid element.

8. A piezoelectric ceramic as set forth in claim 6, wherein the carbon content after sintering is over 4 ppm by weight.

9. A piezoelectric ceramic as set forth in claim 7, wherein the carbon content after sintering is over 4 ppm by weight.

10. A piezoelectric device comprising a piezoelectric ceramic as set forth in claim 1.

11. A piezoelectric device comprising a piezoelectric ceramic as set forth in claim 2.

12. A piezoelectric device comprising a piezoelectric ceramic as set forth in claim 3.

13. A piezoelectric device comprising a piezoelectric ceramic as set forth in claim 4.

14. A piezoelectric device comprising a piezoelectric ceramic as set forth in claim 5.

15. A piezoelectric device comprising a piezoelectric ceramic as set forth in claim 6.

16. A piezoelectric device comprising a piezoelectric as set forth in claim 7.

17. A piezoelectric device comprising a piezoelectric ceramic as set forth in claim 8.

18. A piezoelectric device comprising a piezoelectric ceramic as set forth in claim 9.

* * * * *